United States Patent [19]

Mariani

[11] Patent Number: 5,138,215
[45] Date of Patent: Aug. 11, 1992

[54] SAW REFLECTIVE ARRAY CORRELATOR WITH AMPLITUDE ERROR COMPENSATING POLYMER REFLECTIVE ARRAY GRATING

[75] Inventor: Elio A. Mariani, Hamilton Square, N.J.

[73] Assignee: The United States of America as represented by the Secretary of the Army, Washington, D.C.

[21] Appl. No.: 702,524

[22] Filed: May 20, 1991

[51] Int. Cl.$^5$ .............................................. H01L 41/08
[52] U.S. Cl. ................................ 310/313 D; 333/153; 333/195
[58] Field of Search .................... 310/313 D; 333/153, 333/195

[56] References Cited

U.S. PATENT DOCUMENTS

| | | | |
|---|---|---|---|
| 3,978,437 | 8/1976 | Paige | 333/195 |
| 4,618,841 | 10/1986 | Riha | 333/195 |
| 4,623,853 | 11/1986 | Watanabe et al. | 310/313 D |
| 4,672,254 | 6/1987 | Dolat et al. | 310/313 R |
| 4,745,321 | 5/1988 | Raschke | 310/313 D |
| 4,773,138 | 9/1988 | Ballato et al. | 310/313 D |
| 4,801,836 | 1/1989 | Mariano | 310/313 D |
| 4,916,416 | 4/1990 | Desbois | 333/195 |

FOREIGN PATENT DOCUMENTS

| | | | |
|---|---|---|---|
| 0057021 | 4/1982 | Japan | 333/195 |
| 0258512 | 11/1987 | Japan | 333/153 |
| 0875591 | 10/1981 | U.S.S.R. | 310/313 D |
| 1136309 | 1/1985 | U.S.S.R. | 333/195 |

OTHER PUBLICATIONS

500 MHz Bandwidth RAC Filter with Constant Groove Depth, by H. Gerard et al., 1978 Ultrasonic Symposium Proceedings.

Primary Examiner—Mark O. Budd
Assistant Examiner—Thomas M. Dougherty
Attorney, Agent, or Firm—Michael Zelenka; Robert A. Maikis

[57] ABSTRACT

Amplitude error compensation is provided for a surface acoustic wave (SAW) reflective array correlator (RAC) device having a first reflective array grating fed by an input interdigital transducer and a second reflective array grating which feeds the reflected SAW signal output from the first array grating to an output interdigital transducer. A third or auxiliary reflective array grating is disposed between the first and second array gratings to reflect a portion of the SAW signals reflected from the first array grating to the second array grating to an acoustic absorber. The portion of the SAW signals reflected to the acoustic absorber are those SAW signals which when present in the output of the second array grating which is fed to the output transducer produce the unwanted amplitude errors. The third reflective array grating is fabricated of a photosensitive polymer material so that the frequency and amplitude selective configuration of the grating may be obtained by using photolithographic techniques.

6 Claims, 2 Drawing Sheets

SAW REFLECTIVE ARRAY CORRELATOR WITH AMPLITUDE ERROR COMPENSATING POLYMER REFLECTIVE ARRAY GRATING

GOVERNMENT INTEREST

The invention described herein may be manufactured, used and licensed by or for the Government for governmental purposes without the payment to me of any royalties thereon.

FIELD OF INVENTION

This invention relates to surface acoustic wave (SAW) devices and more particularly to a SAW reflective array correlator wherein unwanted time sidelobes or amplitude errors in the output of the correlator are minimized or eliminated by the use of a polymer reflective array grating.

DESCRIPTION OF THE PRIOR ART

SAW devices essentially convert input RF electric signals into surface acoustic waves (SAWs) for the purpose of signal processing or for obtaining a time delay, for example, and then reconvert the processed or delayed SAWs back into output RF electric signals. These devices are extremely useful because the very low velocity of acoustic waves relative to the velocity of electromagnetic waves makes it possible to produce relatively long electric signal time delays in a device having a very small physical size.

SAW reflective array correlators or compressors (RACs) are often used for bandwidth dispersive applications, such as pulse compression and chirp signal processing, for example. The SAW RAC devices used in these applications play an important role in modern compressive microscan receivers such as advanced military signal intelligence receivers, for example, where the presence of amplitude error or ripple in the RAC output contribute to time sidelobes which adversely affect receiver dynamic range. Similarly, SAW RAC devices are also used in modern pulse compression radars where the presence of amplitude error in the RAC output will again contribute to time sidelobes which adversely affect the target resolution capability of the radar.

Unfortunately, several factors, such as production imperfections in the fabrication of the SAW RACs, for example, cause the RACs to have the unwanted amplitude errors or ripple in their output and thus to degrade their performance for the abovementioned applications. At the present time, however, normal SAW RAC device operation does not employ any internal amplitude error compensation but only provides for phase error compensation by means of a thin metal phase plate or film which is patterned to compensation for the phase errors.

SUMMARY OF THE INVENTION

It is an object of this invention to provide a SAW RAC having internal amplitude error compensation means employing a polymer reflective array grating.

It is a further object of this invention to provide a SAW RAC having internal amplitude error compensation means which may be fabricated relatively simply and inexpensively using established manufacturing techniques.

It is a still further object of this invention to provide a SAW RAC having an amplitude error compensating polymer reflective array grating which may be patterned by using well known photolithographic techniques.

Briefly, the amplitude error compensated SAW RAC of the invention comprises a piezoelectric crystal substrate having a pair of oppositely disposed ends and a planar surface between the ends. Input interdigital transducer means are disposed on the substrate surface adjacent one of the pair of substrate ends for propagating SAW signals along a first path on the substrate surface toward the other of the pair of substrate ends in response to an input RF signal applied to the transducer means. Output interdigital transducer means are disposed on the substrate surface adjacent the one substrate end for converting SAW signals travelling along a second path on the substrate surface from the other substrate end toward the one substrate end to an output RF signal. The output RF signal contains known amplitude errors at known frequencies. The second path is substantially parallel to the first path. First dispersive reflective array grating means are disposed along the first path for reflecting the SAW signals travelling along the first path along a plurality of frequency dispersed third paths on the substrate surface toward the second path. The third paths traverse the second path. Second dispersive reflective array grating means are disposed along the second path for reflecting the SAW signals travelling along the plurality of third paths along the second path toward the output transducer means. Acoustic absorber means are disposed on the substrate surface adjacent the other substrate end between the first reflective array grating means and the second reflective array grating means for acoustically absorbing SAW signals travelling along a fourth path on the substrate surface from the one substrate toward the other substrate end. The fourth path is disposed between the first path and the second path and is substantially parallel to the first path and the second path. Third dispersive reflective array grating means having a frequency and amplitude selective configuration are disposed along the fourth path on the substrate surface for reflecting along the fourth path toward the acoustic absorber means amplitude error compensation SAW signals selected from the SAW signals reflected from the first reflective array grating means toward the second reflective array grating means along the plurality of third paths. The amplitude error compensation SAW signals have amplitudes and frequencies which correct for the known amplitude errors at the known frequencies in the output RF signal when the amplitude error compensation SAW signals travelling along the fourth path are deleted from the SAW signals travelling along the second path toward the output transducer and fed to the acoustic absorber means. The third reflective array grating means is a dispersive reflective array grating comprising a plurality of strip reflectors disposed on the surface of the substrate. Each of the plurality of strip reflectors is fabricated of a photosensitive polymer material.

The nature of the invention and other objects and additional advantages thereof will be more readily understood by those skilled in the art after consideration of the following detailed description taken in conjunction with the accompanying drawings.

DESCRIPTION OF THE PREFERRED EMBODIMENT OF THE INVENTION

Figure 1:
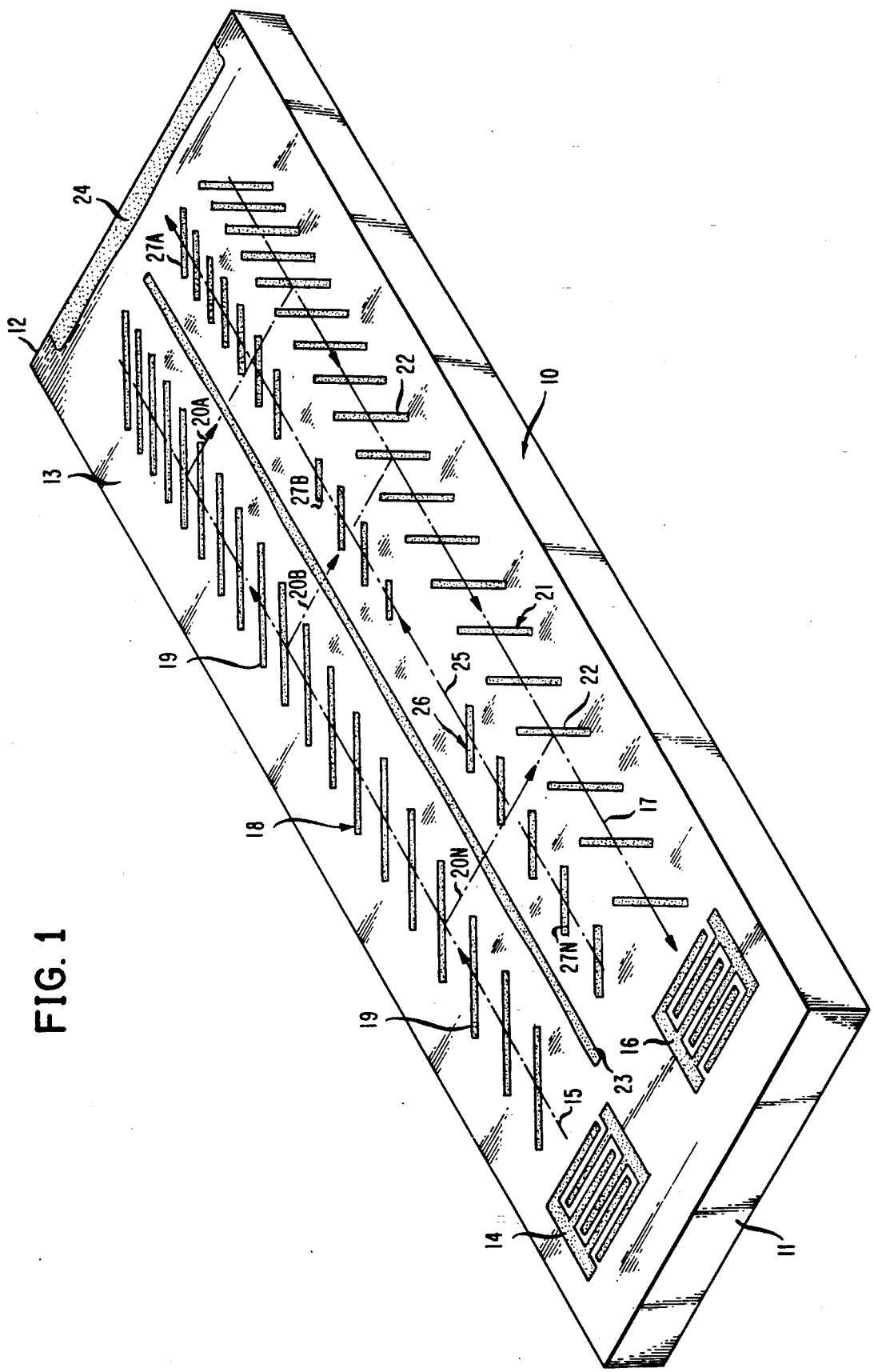
FIG. 1 is a schematic perspective view of the amplitude error compensated SAW RAC of the invention.

Referring now to FIG. 1 of the drawings, there is shown an amplitude error compensated SAW RAC constructed in accordance with the teachings of the present invention comprising a piezoelectric crystal substrate, indicated generally as 10, which has a pair of ends 11 and 12 and a planar surface 13 between the ends 11 and 12. An input interdigital transducer 14 is disposed on the substrate surface 13 adjacent the substrate end 11 and propagates SAW signals along a first path indicated schematically by the dot-dash line 15 on the substrate surface toward the other end 12 of the substrate in response to an input RF signal applied to the transducer means. The width of the path 15 over which the SAW signals are transmitted is, of course, approximately the same width as the transducer 14. The transducer 14 may comprise a thin film of aluminum or other conductive metal which is deposited on the surface 13 of the substrate in accordance with well known fabrication techniques. The input RF signal voltage is applied between the two interleaved sets of fingers of the transducer and the input leads have been omitted from the drawing for simplicity of illustration. An output interdigital transducer 16 is disposed on the substrate surface 13 adjacent the same substrate end 11 and serves to convert SAW signals travelling along a second path indicated schematically by a dot-dash line 17 from the other substrate end 12 toward the substrate end 11 to an output RF signal which usually contains amplitude errors at certain frequencies. These amplitude errors and the frequencies at which they occur may be ascertained or become "known" from the RF signal output by means of amplitude vs. frequency tests which are well known in the art. The output transducer 16 is of the same construction as the input transducer 14 and may be fabricated in the same manner.

First dispersive reflective slanted array grating means, indicated generally as 18, are disposed along the first path 15 on the substrate surface 13. The first dispersive reflective array grating means 18 comprises a plurality of reflectors 19 which are slanted approximately 45 degrees with respect to the propagation path 15 so that the SAW signals travelling along the first path 15 from the input transducer 14 are reflected by these reflectors along a plurality of frequency dispersed third paths indicated schematically by the dot-dash lines 20A, 20B,-20N which are disposed approximately 90 degrees with respect to the axis of the first path 15, whereby the reflected SAW signals are directed toward a second dispersive reflective array grating means, indicated generally as 21, which is disposed along the second path 17. The reflected SAW signals travelling along the plurality of third paths 20A through 20N from the first array grating 18 are further reflected toward the output transducer 16 by the individual reflectors 22 which form the second array grating 21 because the reflectors 22 of the second array grating are almost perpendicular with respect to the corresponding reflectors 19 of the first array grating 18. Both the first and the second reflective slanted array grating means are dispersive gratings which means that the spacing between adjacent individual reflectors in each array grating varies as a function of the distance from the end 11 of the substrate to the end 12 of the substrate so that the plurality of third paths 20A through 20N are frequency dispersed. For example, with the array configuration illustrated, the frequency of the SAW signals reflected along the third path 20N, which is the path closest to the end 11 of the substrate, would be lower than the frequency of the SAW signals reflected along the third paths 20B and 20A which are closer to the other end 12 of the substrate, so that the frequency of the reflected SAW signals would increase as a function of the distance of the third path from the substrate end 11.

The individual strip reflectors of the array gratings 18 and 21 may be formed on the substrate 10 by means of thin-film deposits of aluminum on the surface 13 of the substrate or by means of shallow grooves which are etched into the substrate surface in accordance with known techniques. A phase plate 23 which may comprise a thin film of aluminum or other conductive metal is formed on the surface 13 of the substrate between the first array grating 18 and the second array grating 21 and is patterned in accordance with well known techniques to compensate for phase errors appearing in the output RF signal from the output transducer 16. The phase plate 23, however, merely changes the propagation velocity of the reflected SAW signals travelling along the third paths 20A through 20N and therefore will not compensate for amplitude errors which appear in the output RF signal from the transducer 16. The fabrication and operation of the SAW RAC thus far described is well known in the art and will not be described further herein except to note that the substrate 10 is usually made of quartz when the individual strip reflectors of each of the arrays 18 and 21 are made of metal reflecting strips and is made of a material such as lithium niobate when the individual reflectors of each array are formed by etched grooves.

The SAW RAC of the invention also provides internal amplitude error compensation by means which will now be described. As seen in FIG. 1, acoustic absorber means 24 are disposed on the surface 13 of the substrate 10 adjacent the substrate end 12. The acoustic absorber means 24 are disposed between the first reflective array grating means 18 and the second reflective array grating means 21 and serve to acoustically absorb SAW signals travelling along a fourth path 25 on the substrate surface 13 from substrate end 11 toward substrate end 12. It will be noted that the fourth path 25 is disposed between the first path 15 and the second path 17 and is substantially parallel to both the paths 15 and 17. In practice, the acoustic adsorber means may comprise an area of acoustically absorbing material such as rubber cement, silicone adhesive or wax, for example, which is deposited on the substrate surface 13.

The SAW RAC of the invention also comprises third or auxiliary dispersive reflective array grating means, indicated generally as 26, which are disposed along the fourth path 25 on the substrate surface 13. The third dispersive reflective array grating means 26 has a frequency and amplitude selective configuration formed by a plurality of discreet packets 27A, 27B,-27N which are each composed of varying numbers of individual strip reflectors. The reflectors in each of the packets 26A through 26N should have the same periodicity and angular orientation as the reflectors 19 of the first dispersive array grating 18. The function of this auxiliary reflective array grating 26 is to reflect along the fourth path 25 toward the acoustic absorber means 24 amplitude error compensation SAW signals which are selected from the SAW signals travelling along the plurality of frequency dispersed third paths 20A through 20N from the first array grating 18 to the second array grating 21. The amplitude error compensation SAW signals which are reflected along the fourth path 25 by the third or auxiliary array grating 26 have amplitudes and frequencies which correct for the known amplitude errors at the known frequencies in the output RF signal from output transducer 16 when the amplitude error compensation SAW signals travelling along the fourth path 25 are deleted from the SAW signals travelling along the second path 17 and fed to the acoustic absorber means 24 where they are harmlessly absorbed.

In accordance with the invention, the third or auxiliary dispersive reflective array grating 26 is formed by strip reflectors which are fabricated of a photosensitive polymer material. The term "photosensitive polymer material" as used herein denotes a polymer material such as polyimide or a polymer photoresist material such as polymethylmethacrylate which is easily patterned or shaped by making use of known photolithographic techniques. The individual strip reflectors of the third array grating 26 would have a uniform thickness, i.e. height as measured from the substrate surface 13, and would be disposed in the discreet packets 27A through 27N which form the array grating. The discreet packets 27A through 27N of reflectors in the auxiliary array grating 26 are located at those spatial positions or selected points along the length of the fourth path 25 which correspond to the SAW signal frequencies responsible for the known amplitude errors at the known frequencies in the output RF signal from the output transducer 16. These selected points or spatial locations would be at frequencies where the insertion loss of the SAW device was maximum, i.e., regions of maximum amplitude vs. frequency response. The number of reflectors in each of the plurality of discreet packets of reflectors 27A through 27N may be selectively varied to control both the amplitudes and frequencies of the fourth path amplitude error compensation SAW signals which are deleted from the normal RAC output SAW signals travelling along the second path 17 to the output transducer 16. Similarly, the shape of the "envelope" of each of the plurality of discreet packets of reflectors 27A through 27N may be selectively varied to effect a finer or "vernier" adjustment of amplitudes and frequencies of the amplitude error compensation SAW signals. The shape of the envelope of a packet of reflectors may be controlled by selectively varying the lengths of the individual strip reflectors forming that particular packet. For example, in packet 27B of the array configuration shown in FIG. 1, the envelope shape is somewhat elliptical because the first and the last reflectors in the packet are shorter in length than the two center reflector strips.

The amplitude error compensated SAW RAC device of the invention may be fabricated in the following manner. After or when the first dispersive array grating 18 and the second dispersive array grating 21 are formed on the substrate surface 13 together with the transducers 14 and 16 and the phase plate 23, the acoustic absorber 24 may be formed on the surface of the substrate together with a linearly dispersive array of the polymer reflector strips 27 of the third or auxiliary reflective array grating 26. The third array grating 26 at this time would have exactly the same configuration as the first array grating 18 and would not be divided into the discreet groups or packets of reflectors 27A through 27N. The preliminary amplitude vs. frequency tests would then be made and the polymer reflector strips of the third array grating 26 would be selectively removed using photolithographic techniques leaving behind only the desired packets and configurations of packets needed to effect the amplitude error compensation. Although it is possible to fabricate the SAW RAC of the invention by performing the amplitude vs. frequency tests before the third or auxiliary reflective array grating 26 is placed on the substrate surface 13 and then to place the desired number of packets and packet configurations at the desired points along the length of the fourth path 25 in the third array grating until any amplitude errors appearing in the output of the SAW RAC device were eliminated or minimized to a satisfactory point, the most practical and straight-forward way would appear to be to place the entire complete third array on the grating and then to selectively remove individual reflector strips as needed to form the desired number of packets and packet shapes. By fabricating the third reflective array grating 26 from reflector strips made of a photosensitive polymer material, the aforementioned well known photolithographic techniques may be readily and inexpensively employed to create the amplitude error compensation desired. It should be pointed out, of course, that the polymer reflector strips of the third or auxiliary array grating 26 may be utilized regardless of the type of reflector strips that make up the first reflective array grating 18 and the second reflective array grating 21, i.e., metallic strips or grooves.

Figure 2:
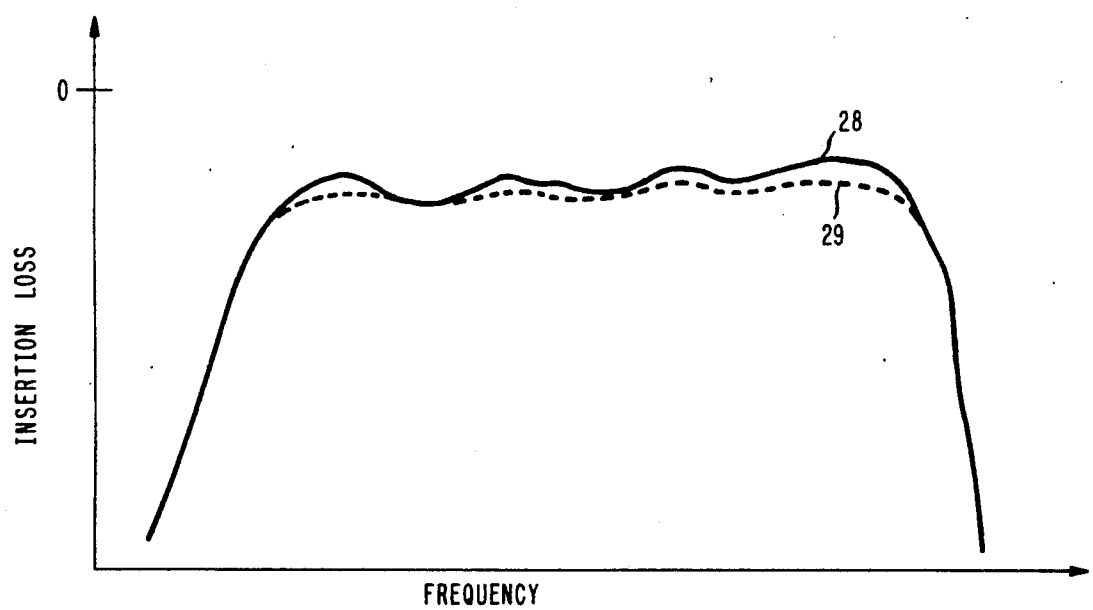
FIG. 2 is a graphical representation showing the insertion loss as a function of frequency for both amplitude error compensated SAW RACs and uncompensated SAW RACs.

FIG. 2 of the drawings is a graphical representation showing insertion loss of a SAW RAC device as a function of frequency over the operating frequency bandwidth of the device. Curve 28 shows the response of a SAW RAC which does not have amplitude error compensation while curve 29 shows the response of an amplitude error compensated SAW RAC device. From an inspection of FIG. 2, it will be noted that curve 29 is much flatter than curve 28 over the operating frequency bandwidth of the device showing that the unwanted fluctuations in insertion loss which represent the unwanted amplitude errors or ripples are effectively minimized or eliminated.

It is believed apparent that many changes could be made in the construction and described uses of the foregoing amplitude error compensated SAW RAC and many seemingly different embodiments of the invention could be constructed without departing from the scope thereof. Accordingly, it is intended that all matter contained in the above description or shown in the accompanying drawings shall be interpreted as illustrative and not in a limiting sense.

What is claimed is:

1. An amplitude error compensated SAW reflective array correlator comprising:
   a piezoelectric crystal substrate having a pair of oppositely disposed ends and a planar surface between said ends;
   input interdigital transducer means disposed on said substrate surface adjacent one of said pair of substrate ends for propagating SAW signals along a first path on said substrate surface toward the other of said pair of substrate ends in response to an input RF signal applied to said transducer means;

output interdigital transducer means disposed on said substrate surface adjacent said one substrate end for converting SAW signals travelling along a second path on said substrate surface from said other substrate end toward said one substrate end to an output RF signal, said output RF signal containing known amplitude errors at known frequencies, said second path being substantially parallel to said first path;

first dispersive reflective array grating means disposed along said first path for reflecting the SAW signals travelling along said first path along a plurality of frequency dispersed third paths on said substrate surface toward said second path, said third paths traversing said second path;

second dispersive reflective array grating means disposed along said second path for reflecting the SAW signals travelling along said plurality of third paths along said second path toward said output transducer means;

acoustic absorber means disposed on said substrate surface adjacent said other substrate end between said first reflective array grating means and said second reflective array grating means for acoustically absorbing SAW signals travelling along a fourth path on said substrate surface from said one substrate end toward said other substrate end, said fourth path being disposed between said first path and said second path and being substantially parallel to said first path and said second path; and third dispersive reflective array grating means having a frequency and amplitude selective configuration disposed along said fourth path on said substrate surface for reflecting along said fourth path toward said acoustic absorber means amplitude error compensation SAW signals selected from said SAW signals reflected from said first reflective array grating means toward said second reflective array grating means along said plurality of third paths, said amplitude error compensation SAW signals having amplitudes and frequencies which correct for said known amplitude errors at said known frequencies in said output RF signal when said amplitude error compensation SAW signals travelling along said fourth path are deleted from said SAW signals travelling along said second path toward said output transducer and fed to said acoustic absorber means, said third reflective array grating means being a dispersive reflective array grating comprising a plurality of strip reflectors disposed on said surface of said substrate, each of said plurality of strip reflectors being fabricated of a photosensitive polymer material, each of said first, second and third reflective array grating means comprising a linearly dispersive reflective array grating, said first, second and third dispersive reflective array gratings have the same periodicity, and said frequency and amplitude selective configuration of said third dispersive reflective array grating comprises a plurality of discrete packets of reflectors disposed at selected points along said fourth path, said selected points being at SAW signal frequencies responsible for said known amplitude errors at said known frequencies in said output RF signal.

2. An amplitude error compensated SAW reflective array correlator as claimed in claim 1 wherein said photosensitive polymer material is polyimide.

3. An amplitude error compensated SAW reflective array correlator as claimed in claim 1 wherein said photosensitive polymer material is a photoresist material.

4. An amplitude error compensated SAW reflective array correlator as claimed in claim 3 wherein said photoresist material is polymethylmethacrylate.

5. An amplitude error compensated SAW reflective array correlator as claimed in claim 1 wherein the number of reflectors in each of said plurality of discrete packets of reflectors is selectively varied to control the amplitudes and frequencies of said fourth path amplitude error compensation SAW signals.

6. An amplitude error compensated SAW reflective array correlator as claimed in claim 1 wherein the shape of the envelope of at least one of said plurality of discrete packets of reflectors is selectively varied by selectively controlling the lengths of the reflectors in said one packet to control the amplitudes and frequencies of said fourth path amplitude error compensation SAW signals.

* * * * *